United States Patent
Horiuchi et al.

[11] Patent Number: 5,997,999
[45] Date of Patent: *Dec. 7, 1999

[54] SINTERED BODY FOR MANUFACTURING CERAMIC SUBSTRATE

[75] Inventors: Michio Horiuchi; Yukiharu Takeuchi; Yoichi Harayama, all of Nagano, Japan

[73] Assignee: Shinko Electric Industries Co., Ltd., Nagano, Japan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/957,306

[22] Filed: Oct. 23, 1997

Related U.S. Application Data

[63] Continuation of application No. 08/493,611, Jun. 22, 1995, abandoned.

[30] Foreign Application Priority Data

Jul. 1, 1994 [JP] Japan .................................. 6-150825
Feb. 2, 1995 [JP] Japan .................................. 7-033508

[51] Int. Cl.⁶ ...................................................... B32B 3/00
[52] U.S. Cl. .......................... 428/210; 428/328; 428/432; 428/433; 428/434; 174/251; 264/108; 29/851; 29/884
[58] Field of Search .................................... 174/250, 251; 29/602, 851, 787, 884; 264/108; 428/210, 320.2, 432, 433, 434, 328; 439/68, 66, 91

[56] References Cited

U.S. PATENT DOCUMENTS

| | | | |
|---|---|---|---|
| 3,483,499 | 12/1969 | Lugten | 336/200 |
| 3,528,172 | 9/1970 | Smukowski | 29/602 |
| 5,229,213 | 7/1993 | Horiuchi et al. | 428/457 |
| 5,240,671 | 8/1993 | Carey | 419/9 |
| 5,702,807 | 12/1997 | Horiuchi | 428/210 |
| 5,733,640 | 3/1998 | Horiuchi et al. | 428/210 |

FOREIGN PATENT DOCUMENTS

| | | |
|---|---|---|
| 0 444 216 | 9/1991 | European Pat. Off. . |
| 0 584 726 | 3/1994 | European Pat. Off. . |
| 1 227 965 | 11/1966 | Germany . |
| 89-230094 | of 0000 | Japan . |
| 60-009146 | 1/1985 | Japan . |
| 62139345 | 6/1987 | Japan . |
| 2-267989 | 11/1990 | Japan . |
| 1-230094 | 4/1991 | Japan . |
| 4-179194 | 6/1992 | Japan . |

OTHER PUBLICATIONS

*Patent Abstracts of Japan*, vol. 15, No. 273 (E–1088), Jul. 11, 1991 & JP–A–03 093290 (Fujitsu), Apr. 18, 1991.
*Patent Abstracts of Japan*, vol. 16, No. 97 (E–1176), Mar. 10, 1992 & JP–A–03 276797 (Fujitsu), Dec. 6, 1991.

*Primary Examiner*—Deborah Jones
*Assistant Examiner*—Cathy F. Lam
*Attorney, Agent, or Firm*—Staas & Halsey LLP

[57] ABSTRACT

A sintered body, for manufacturing a ceramic substrate, on which a via can be formed with high positional accuracy and the substrate is not warped and further the productivity is high. The sintered body includes a pillar-shaped ceramic body and metallic wiring rods provided in the ceramic body in parallel with the axis. The metallic wiring rods are made of metal, the melting point of which is lower than the sintering temperature of the sintered ceramic body.

10 Claims, 3 Drawing Sheets

SINTERED BODY FOR MANUFACTURING CERAMIC SUBSTRATE

This application is a continuation, of application Ser. No. 08/493,611, filed Jun. 22, 1995, now abandoned.

BACKGROUND OF THE INVENTION

1. Field of the Invention

The present invention relates to a sintered body for manufacturing a ceramic substrate. The present invention also relates to a ceramic substrate, and a manufacturing method thereof.

2. Description of Related Art

In accordance with recent developments in highly integrated electronic devices, there is a demand for fine and very dense wiring on a substrate. In order to meet the demand, a method in which the fine wiring is provided on a ceramic substrate using a thin film is widely employed. When a via conductor is formed penetrating the ceramic substrate, both sides of the substrate can be effectively used, so that very dense wiring can be realized. For this reason, this method is widely used, and this substrate is put into practical use for assembling semiconductor packages.

When the wiring becomes finer, blow holes in the ceramic, opening onto the substrate surface, might be a cause of disconnection or high resistance. When the via position is slightly displaced, it could be a cause of defective electric continuity. Therefore, in order to form fine and very dense wiring using a thin film, it is necessary that the ceramic substrate be dense, that the number of blow holes be small, and, further, that the surface be flat. In addition, the positional accuracy of the via must be high. Further, there is a strong requirement for a reduction in the cost.

Conventionally, the following method is employed to manufacture a ceramic substrate having the via described above. First, a ceramic green sheet is provided. After the ceramic green sheet has been subjected to punching so as to form a predetermined shape, through-holes are formed at predetermined positions. Next, the through-holes are filled with metallic paste. At least two layers of green sheets that have been processed in this way are laminated. The thus obtained laminated body is subjected to binder-removal treatment and then fired or burned. In this way, the substrate is formed. In this case, a substrate that has warped badly is corrected or rejected. The substrate is then cut into a predetermined shape and polished, and the manufacture of the substrate is completed.

In the above manufacturing process, when the thickness of the substrate is small, it is possible to fill the through-holes with metallic paste after the green sheets have been made into a laminated body. However, in many cases, it is necessary to fill the through-holes with metallic paste for each green sheet. The number of substrates obtained from one sheet of green sheet lamination body is approximately 1 to 4. When the size of the green sheet lamination body is increased so as to increase the number of substrates obtained from one sheet of green sheet lamination body, not only the working efficiency is lowered but also the positional accuracy of the via is deteriorated. After all, the unit number handled in the process is approximately the same from the first to the final stage. Accordingly, the number of the obtained substrates, per one process or one device, is small. Therefore, a sufficiently high mass-production effect cannot be provided, and it is impossible to reduce the cost. Further, due to the defective electric continuity caused by a displacement of the via in the process of lamination and also due to the warping of the substrate, it is difficult to reduce the cost.

SUMMARY OF THE INVENTION

The present invention has been accomplished to solve the above problems. An object of the present invention is to provide a sintered body for manufacturing a ceramic substrate, and the present invention is also to provide a ceramic substrate, and a manufacturing method thereof characterized in that: the positional accuracy of the via is high; the substrate is not warped; and the productivity is high.

According to the present invention, there is provided a pillar-shaped sintered body for manufacturing ceramic substrates, said sintered body comprising: a pillar-shaped ceramic base body having an axis; and one or more metallic wirings arranged inside the insulation base body in parallel to the axis.

It is preferable that the pillar-shaped ceramic base body have a through hole extending in parallel to the axis thereof.

It is also preferable that the ceramic base body have an outer surface, that the metallic wirings are arranged inside the ceramic base body so that the metallic wirings are not exposed onto the outer surface of the ceramic base body, and so that the melting point of the metallic wirings is lower than the firing temperature of the sintered body.

It is also preferable that the metallic wiring is made of copper, gold, silver or aluminum, or alternatively the metallic wiring is made of a metal, the principal component of which is at least one of copper, gold, silver and aluminum.

It is also preferable that a shape of the pillar-shaped sintered body is a selected one of columnar and square.

It is also preferable that the ceramic base body is made of one of alumina ceramic, aluminum nitride ceramic, mullite ceramic, or a ceramic fired at low temperature.

According to another aspect of the present invention, there is provided a ceramic substrate formed into a sheet-shape having an outer surface thereof, onto which surface the metallic wiring is exposed when the sintered body for manufacturing the substrates as described above is cut in a direction perpendicular to the axis to a predetermined thickness.

According to still another aspect of the present invention, there is provided a method of manufacturing a ceramic substrate comprising the steps of: forming a pillar-shaped unfired body comprising a pillar-shaped ceramic base body having an axis, and arranging one or more metallic wire rods (wires) inside the ceramic base body in parallel to the axis, wherein the melting point of the wires is lower than the firing temperature of the ceramic body; firing the unfired body at the firing temperature; and cutting the fired body in a direction perpendicular to the axis by a predetermined thickness to obtain a plurality of substrates.

In this case, the ceramic base body of the pillar-shaped unfired body has a through-hole extending there through in parallel to the axis thereof.

Also, the ceramic base body of the pillar-shaped unfired body is made of ceramic slurry in which an organic binder is not used. The wires are made of aluminum, or a metal the principal component of which is aluminum, and the unfired body is fired in the atmosphere.

According to a still further aspect of the present invention, there is provided a method of manufacturing a ceramic substrate comprising the following steps of: preparing a jig comprising a container having an axis thereof and a plurality of wires arranged inside the container in parallel to the axis; pouring a slurry of ceramic material into the container to obtain an unfired body; cutting off the wires to remove portions thereof protruding from the unfired body; coating ceramic slurry or paste on surfaces of the unfired body onto which the metallic wires are exposed to obtain a pillar-shaped unfired ceramic body within which the metallic wire rods are buried so as to be arranged in parallel to the axis, wherein the melting point of the wires is lower than the firing temperature of the ceramic body; firing the unfired ceramic body at the firing temperature; and cutting the fired body in a direction perpendicular to the axis to a predetermined thickness to obtain a plurality of substrates.

According to the present invention, the manufacturing process is completely different from that of the conventional method, and a ceramic substrate having a via can be provided without having various defects that have suppressed an enhancement in the yield, and further, a sufficiently high mass-production effect can be provided so that the cost can be greatly reduced.

That is, according to the present invention, first, a pillar-shaped sintered ceramic body is obtained in which metallic wiring is provided in parallel with the axis. Next, a ceramic substrate having a via is obtained when the pillar-shaped body is cut off in a direction perpendicular to the axis. Besides, a pillar-shaped sintered ceramic body having a through-hole inside together with the metallic wirings can be obtained. When the sintered ceramic body is cut off a pillar-shaped body with a hole in a direction perpendicular to the axis, a ceramic substrate can be obtained which has a via through to be utilized for accommodating a semiconductor element. In order to provide the aforementioned pillar-shaped sintered body, it is necessary to form a pillar-shaped unfired body. In order to form the pillar-shaped unfired body, it is possible to employ the slip cast forming method and extrusion forming method.

However, it is difficult to form metallic wiring at least after the formation of the unfired body or after the completion of firing. The reasons are as follows. It is difficult to form a long through-hole in the unfired body with high accuracy. Even if the through-hole is formed, it is difficult to fill the through-hole with a metallic paste having a sufficiently high density. Further, it is difficult to form a through-hole in the sintered body. Even if the through-hole is formed in the sintered body, it is very difficult to pour metallic paste or molten metal into the through-hole.

In order to solve the above problems, according to the present invention, wires are used and assembled into an unfired body simultaneously when the unfired ceramic body is formed. These wires are used as the metallic wiring.

Various methods can be employed to form the above unfired body. It is preferable to employ the aforementioned slip cast forming method or extrusion forming method. By these forming methods, it is possible to provide an unfired body from which the metallic wire rods protrude or are exposed.

If necessary, in order to prevent the metallic portion from being exposed when the wires are melted in the process of firing, the end portions of the unfired body are covered with slurry or paste-like ceramic composition after the protruding portions of metallic wire rods have been cut off. In other words, the wires are prevented from evaporating in the process of firing.

After that, the above unfired body is subjected to firing, and a sintered body for manufacturing a ceramic substrate is obtained.

In this connection, the unfired body including the wires shrinks in the process of firing in accordance with an increase of the density. However, there is no tendency for the metallic wire rods to shrink, but there is a tendency to thermal expansion. Therefore, a high stress is commonly generated in the process of firing, which results in damage to the ceramic.

However, according to the present invention, when a metal, the melting temperature of which is lower than the firing temperature of ceramics, is used for the wires, it is possible to prevent the damage of ceramics. It is preferable that the melting point of the metal is approximately equal to a temperature at which the ceramics starts shrinking. Due to the foregoing, when the ceramics starts shrinking, the metallic wire rods are liquidized. Therefore, a problematic stress is not generated as long as there is provided a space for accommodating a liquid metal, the amount of which corresponds to an amount of the reduced volume of ceramics that has been generated in accordance with shrinkage.

It is easy to provide this space by various methods. For example, a predetermined gap may be formed when the end faces of wires are coated with ceramic paste or slurry. Alternatively, the metallic wire rods may be previously coated with a thermal decomposition type polymer, and the polymer is thermally decomposed in the process of firing so that the space can be maintained. However, a ratio of the reduction of the volume of ceramic is approximately 95% and, depending on the dimensions of the unfired body and metallic wires, this space is not necessarily required.

According to the present invention, as described above, the wires are liquidized in the process of firing the ceramic and are contained in the form of liquid metal. Therefore, due to the evaporation, permeation and diffusion of the liquid metal, there is a possibility that the conductive metal disappears, the ceramic is not normally fired, or the metallic wiring is short-circuited. However, with respect to the evaporation of liquid metal, no problems are caused when the end portion of the unfired body is coated with a polymer as described above. Further, it was confirmed that the permeation or diffusion of liquid metal into the ceramics seldom occurred in practice.

The present inventors confirmed that a metal such as copper, gold, silver and aluminum can be simultaneously fired in ceramic such as aluminum nitride ceramic, alumina ceramic, mullite ceramic and ceramic fired at low temperature. Further the present inventors confirmed that copper and gold can be stably used for the formation of metallic wiring.

It is possible to fire various ceramic materials at a conventional temperature and in the conventional atmosphere. In the manner described above, it is possible to obtain a pillar-shaped sintered body having metallic wiring arranged inside the sintered body in parallel with the axis.

From the viewpoint of reduction of cost, it is advantageous that the firing is effected in the atmosphere.

However, the inventors ascertained that copper was oxidized in the atmosphere when it was used for the metallic wire rods. Accordingly, the unfired body including copper wiring rods must be fired in a non-oxidizing atmosphere.

When aluminum was used for the metallic wire rods, it was anticipated that they would be oxidized in the atmosphere in the same manner, however, on the contrary to the anticipation, the wires of aluminum were not oxidized. It was found that an oxide film was formed on the surface of the metallic wire of aluminum. It was considered that this oxide film functioned as a barrier to prevent oxidization so that no oxygen entered the center of the metallic rod. As a result of the investigation, the unfired body including aluminum wires was fired in the atmosphere, at low cost, and no problems were caused regarding electric continuity.

According to the present invention, a slurry-like or paste-like ceramic is used for the formation of an unfired body. That is, unlike the formation of a green sheet effected by the doctor-blade method, the shape-preserving property of an unfired green sheet is not required in the present invention. Therefore, it is not necessary to use an organic binder, or alternatively only a small amount of organic binder is used in the slurry-like or paste-like ceramic. When this ceramic is poured into and dried in a container in which the metallic wire rods are arranged in parallel with the axis, the aforementioned unfired body can be provided.

When an organic binder is used, it is indispensable to remove the binder from the ceramic. When a conventional thick green sheet is used, the binder is not completely removed from ceramic. For this reason, only a thin green sheet, the thickness of which is 3 cm at the most, can be fired.

However, when an organic binder is not used, it is not necessary to conduct removal of the binder. Accordingly, it is possible to burn a sufficiently thick green sheet. For example, it is possible to burn a cylindrical body, the diameter of which is approximately 10 cm and the height of which is approximately 20 cm after the body has been fired. Due to the foregoing, the productivity is greatly enhanced.

It is possible to obtain a ceramic substrate having a via when the aforementioned sintered body is cut in a direction perpendicular to the axis to a predetermined thickness. Depending on the process effected after the substrate has been obtained, and if necessary, an outer periphery is ground before the fired body is cut, or alternatively orientation-flat processing is effected. Commonly, both sides are polished after the cutting of the sintered body.

As described above, a large number of substrates is obtained from one sintered body. For example, it is possible to obtain 180 sheets of substrates, the thickness of which is 0.6 to 0.7 mm, from a columnar sintered body, the height of which is 20 cm. In the above case, the substrates are obtained when the sintered body is cut. Accordingly, unlike a case in which the individual substrates are fired, the substrates obtained in the above manner are not warped in the process of firing. Accordingly, almost all the substrates are transferred to the polishing process in which both sides are polished. In this case, the via conductor is not made by a method in which the green sheets are laminated and connected. Accordingly, there are no problems of electric disconnection and high resistance caused by the displacement of lamination. Since the unfired body is formed into a columnar shape, it shrinks uniformly in the process of firing. Therefore, it is possible to keep the size (diameter) of the substrate constant. When the unfired body has a square cross-section, it is possible to extend the area on the ceramic substrate capable of being effectively used. Further, it is possible to divide the ceramic substrate into several pieces after it has been obtained by cutting the sintered body, and each divided piece can be used as a ceramic substrate.

The ceramic substrate obtained according to the present invention may be put on a ceramic or glass substrate, on the surface of which wiring patterns to be used as an inner wiring layer are provided, so that a package (compound package) can be formed. In the case where this package is used as a product having a cavity for accommodating a semiconductor element, it is effective that a through-hole is previously formed on the ceramic substrate. In this case, a pillar-shaped body, the cross-section of which is rectangular or circular, is prepared, and this pillar-shaped body is arranged in a container into which slurry-like or paste-like ceramic is poured so as to form an unfired body, and also metallic fine wires to be used as via conductors are arranged in the container. The above pillar-shaped body is made in accordance with the shape of a through-hole to be formed on the ceramic substrate. The pillar-shaped body may be made of a material such as one of plastics, ceramics or metal. It is preferable that the pillar-shaped body is made of a ceramic material, the surface of which is smooth. Since the surface of the pillar-shaped body is smooth, the pillar-shaped body can easily be pulled out from the unfired body after formation. It is necessary that the melting temperature of the fine metallic wires is lower than the firing temperature of the ceramic.

Ceramic powder slurry not containing an organic binder at all, or containing only a little organic binder, is poured into the container, and the fine metallic wires are embedded in the ceramic powder slurry so that the end portions of the fine metallic wires are not exposed onto the surface.

After the ceramic powder slurry has dried in the container, the pillar-shaped body penetrating the container is pulled out, and the unfired body having a through-hole is taken out from the container. Next, this unfired body is fired. In this way, a sintered body having the through-hole for manufacturing a ceramic substrate is provided. This sintered body for manufacturing ceramic substrates is sliced in a direction perpendicular to the axis. In this way, ceramic substrates are obtained. On each ceramic substrate, there is provided a through-hole formed by the above pillar-shaped body and also there is provided a via conductor formed in the thickness direction. The through-hole formed on the ceramic substrate is used as a cavity for accommodating a semiconductor element in the case of formation of a compound type package, or alternatively used as a hole for accommodating a circuit part such as a chip condenser.

DESCRIPTION OF THE PREFERRED EMBODIMENTS

Embodiment 1

In Embodiment 1, 98 weight parts of aluminum nitride powder of which the average particle size was approximately 1 μm, 2 weight parts of yttrium oxide, 8 weight parts of acrylic binder, 5 weight parts of di-n-butylphthalate, 1 weight part of surface active agent, and 90 weight parts of butanon were combined and mixed for 48 hours in a ball mill in the same manner as the normal green sheet method. In this way, a slurry was provided.

After the thus obtained slurry was subjected to vacuum defoaming, the viscosity was adjusted to about 10,000 centipoise.

Figure 1:
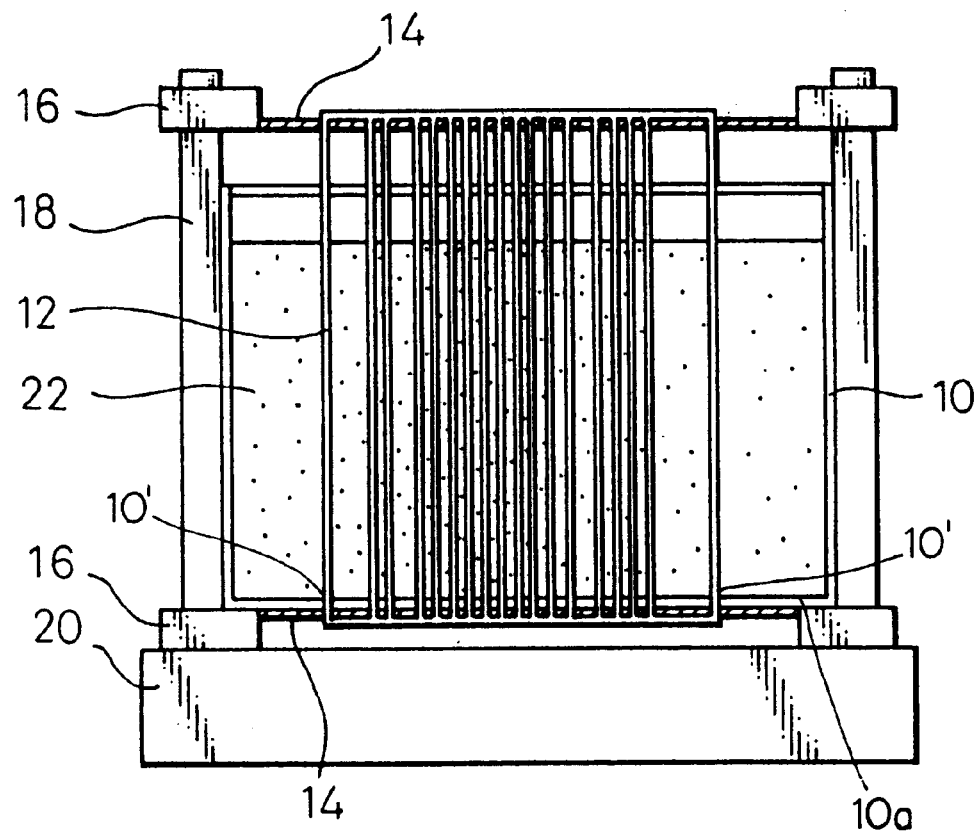
FIG. 1 is a schematic illustration showing the unfired body forming method of Embodiment 1 of the present invention.

As shown in FIG. 1, a jig is previously prepared, which is composed in the following manner. There is provided a cylindrical container 10 made of plastic having a bottom, the diameter of which is approximately 200 mm. On the bottom wall 10a of the cylindrical container 10, a plurality of holes 10' is formed in accordance with a via pattern. A large number of wires 12, the diameter of each of which is approximately 0.24 mm, obtained from a covered wire available on the market, is passed through the holes. Further, the upper and lower ends of the metallic wire rods 12 are passed through respective upper and lower hole plates 14, 14, so that the metallic wire rods are fixed. In this way, a large number of metallic wire rods 12 is stretched in the cylindrical container 10 used as a jig.

In this connection, numerals 16, 16 are support frames for supporting the hole plates 14, 14. Numeral 18 is a post. Numeral 20 is a support base.

The slurry 22 adjusted in the manner described above was poured into the cylindrical container 10 made of plastic. Further, the viscosity of the slurry 22 was adjusted to about 200,000 centipoise using a vacuum cryopump (not shown).

Figure 2:
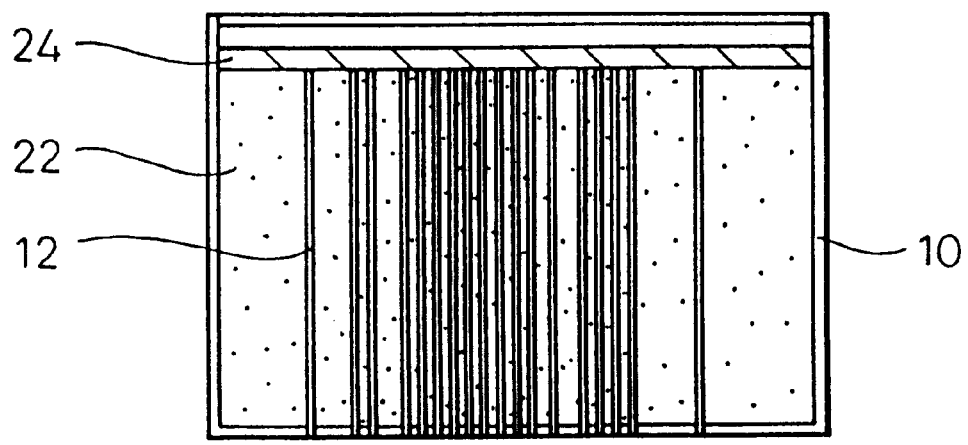
FIG. 2 is a schematic illustration showing a condition in which the slurry is added for covering one end surface after the metallic wire rods of the above unfired body have been cut off.
Figure 3:
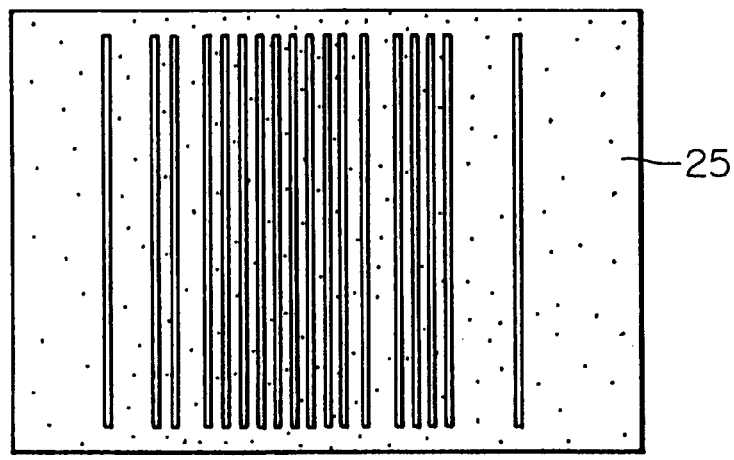
FIG. 3 is a schematic illustration showing an unfired body, the other end surface of which is also covered with unfired ceramic.

While the slurry was open to the atmosphere, it was left and dried for twenty-four hours. Then, the protruding ends of the metallic wires 12 were cut off, and an aluminum nitride slurry 24 of the same composition as that of the above slurry, the viscosity of which was approximately 70,000 centipoise, was poured into the container (shown in FIG. 2). After the slurry 24 had dried, the thus formed unfired body was taken out from the cylindrical container 10. Aluminum ni ride slurry or aluminum nitride paste was coated on a bottom surface of the unfired body from which the metallic wire rods protrude and are exposed, that is, the surface of the unfired body that had been in contact with the bottom of the cylindrical container 10, and then the coated aluminum nitride slurry or aluminum nitride paste was sufficiently dried (shown in FIG. 3). In this case, the height of the column of the unfired body 25 was approximately 14 cm. The slip cast forming method is described above.

Figure 4:
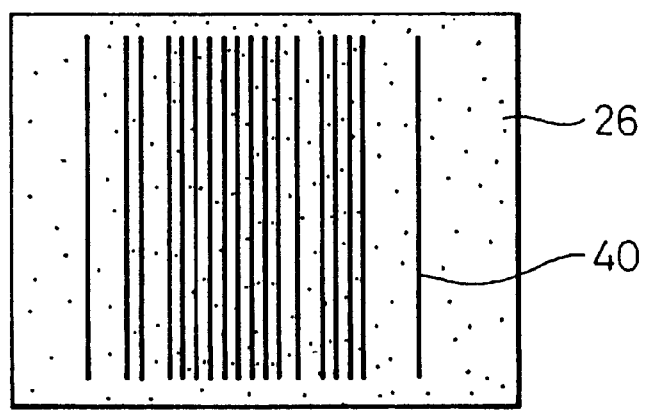
FIG. 4 is a schematic illustration showing a sintered body for manufacturing a ceramic substrate obtained when the above unfired body is fired.

The unfired body was subjected to binder-removal treatment in an atmosphere of wet $N_2$. After that, the unfired body was fired for 5 hours at the maximum temperature of 1800° C. in a cell made of BN (boron nitride) in the atmosphere of dry $N_2$, so that a sintered body 26 (i.e., a sintered body for manufacturing a ceramic substrate) was provided (shown in FIG. 4). The sintered body was divided into halves with a slicer, and it was ascertained that the metallic wiring body 40 composed of copper was formed inside in a good condition.

Figure 5:
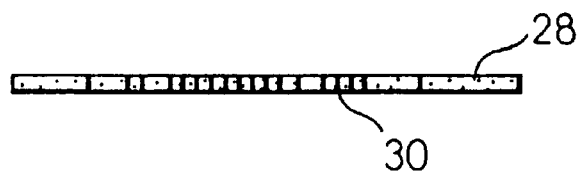
FIG. 5 is a schematic illustration showing a ceramic substrate having a via obtained when the above sintered body is sliced.

When the sintered body 26 was cut with the slicer in a direction perpendicular to the axis, a ceramic substrate 28 having the via 30 was obtained (shown in FIG. 5).

Embodiment 2

In Embodiment 2, 92 weight parts of alumina powder of which the average particle size was 2 μm, 8 weight parts of a sintering assistant composed of silicon oxide, magnesium oxide and calcium carbonate, 4 weight parts of polyvinyl alcohol, 3.5 weight parts of glycerine and 25 weight parts of pure water were added. Using a pressure kneader, the thus obtained mixture was subjected to the primary kneading, and then it was subjected to the secondary kneading under a decompressed condition. The obtained paste was formed into a square-pillar-shaped unfired body, the length of the side of which was 150 mm, including metallic wire rods of copper, the diameter of each of which was approximately 0.4 mm, using a vacuum extruder (not shown) of the prior art to which a base having a wire guide was attached. After the above paste had been coated on both end surfaces of this unfired body, it was subjected to binder-removal treatment in the atmosphere of wet $N_2$. Then the unfired body was fired in a cell of mullite for firing use at the maximum temperature of 1550° C. in an atmosphere of dry $N_2$ for 2 hours, so that a sintered body (sintered body for manufacturing a ceramic substrate) was provided. The thus obtained fired body was cut into ceramic substrates, the thickness of which was approximately 1.0 mm, using a slicer. It was ascertained that the via conductor was formed in a good condition.

In this embodiment, instead of the wires made of copper, metallic wire rods made of gold were used, and the unfired body was fired in the aforementioned atmosphere or in the atmospheric air. It was ascertained that the via was formed in a good condition in this case, too.

Embodiment 3

In this embodiment, to 98 weight parts of electromelting mullite powder, the average particle size of which was approximately 2 μm, 2 weight parts of yttrium oxide powder, the average particle size of which was approximately 1 μm, were added. This mixture was mixed with and dispersed in 100 weight parts of ethanol using a homogenizer at the rotational speed of 7500 rpm for 30 minutes.

The above slurry was moved to a cylindrical container, the principal component of which was aluminum. After a predetermined period of time had passed, wires made of copper, the diameter of which was approximately 0.4 mm, were set in the sediment using a support plate, and further the slurry was left and subjected to sedimentation. Finally, the above wires were cut off from the support plate, and the slurry was supplied until the metallic wire rods were embedded in the sediment. After that, the slurry was subjected to natural sedimentation.

When a change in the level of the sedimentation decreased with the lapse of time, the clear layer at the top of the slurry, which was ethanol, was removed. After the slurry was naturally dried for 3 hours, it was dried by infrared rays for one hour. Together with the container, this slurry was fired in an atmosphere of dry $N_2$ at the maximum temperature of 1540° C. for 2 hours, so that a sintered body was obtained.

Since the sintered body shrank in the process of firing, it was easily taken out from the container. The sintered body was sliced so as to obtain a ceramic substrate, the thickness of which was approximately 1.0 mm, and it was ascertained that the via conductor was formed in the substrate in a good condition.

Embodiment 4

In this embodiment, 100 weight parts of ethanol was added to 100 weight parts of 92 weight % of an alumina composition which was the same as that of Embodiment 2, and a slurry was obtained in the same manner as that of Embodiment 3. Aluminum wires, the diameter of which was approximately 0.4 mm, were embedded in the slurry, and a sediment body was obtained in the same manner as that of Embodiment 3. The thus obtained sedimentation body was fired in the atmosphere together with the container at the maximum temperature of 1550° C. for 2 hours.

Both end portions of the obtained cylindrical sintered body were cut for inspection, and silver color metallic luster was observed in the metallic wiring body (via portion). Further, an electric continuity test was effected with a tester, and it was ascertained that both end portions were electrically continuous.

Embodiment 5

In this embodiment, 100 weight parts of ethanol were added to 100 weight parts of a composition in which 50 volume % of boro-silicate glass powder was added to the same alumina powder as that of Embodiment 2, and in the same manner as that of Embodiment 3, a slurry was obtained. Silver wire rods, the diameter of which was approximately 0.4 mm, were embedded in the slurry, and a sedimentation body was obtained in the same manner as that of Embodiment 3.

The thus obtained sedimentation body was fired in the atmosphere at the maximum temperature of 980° C. for 2 hours. The thus obtained sintered body was sliced by a slicer so that a substrate, the thickness of which was approximately 1.0 mm, was cut off, and it was ascertained that the via conductor was formed in a good condition.

Also in this embodiment, even when the wires of aluminum were used instead of the metallic wire rods of silver, it was ascertained that the via conductor was formed in a good condition. Even in a case in which the metallic wire rods of copper were used and the unfired body was fired, in an atmosphere of dry $N_2$ at a maximum temperature of 110° C. for 2 hours, it was ascertained that the via conductor was formed in a good condition.

Embodiment 6

Figure 6:
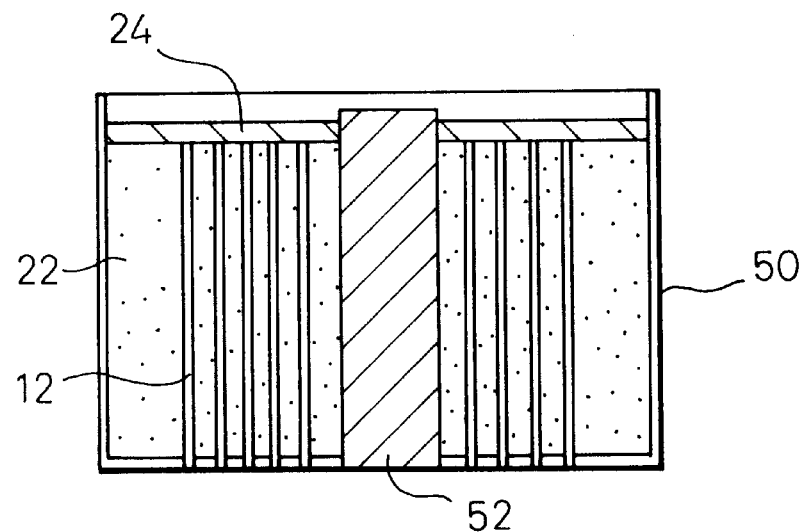
FIG. 6 is a schematic illustration showing a method by which the slurry is subjected to sedimentation in Embodiment 6.

In this embodiment, 92 weight parts of alumina powder, the average particle size of which was approximately 2 $\mu$m, 8 weight parts of a sintering assistant composed of silicon oxide, magnesium oxide and calcium carbonate, 0.5 weight part of polyvinyl alcohol, and 50 weight parts of ethanol were added. The thus obtained mixture was milled in a ball mill, so that a slurry was made. As a container in which this slurry was subjected to sedimentation, a cylindrical container 50 made of NC nylon, the outer diameter of which was approximately 10 cm, was used, and a square pillar 52 made of NC nylon, the length of the side of which was 20 mm, was arranged at the center of the container 50 in parallel with the axis. A large number of copper wires, the diameter of which was approximately 0.3 mm, was arranged outside the square pillar so that the copper wires were used as the metallic wire rods 12. After that, the above slurry 22 was poured into the container 50 and subjected to sedimentation. After the completion of sedimentation, copper wires protruding from the surface of the sediment body were cut at the points close to the surface, and the slurry 24 was additionally poured onto the surface. The poured slurry 24 was subjected to sedimentation so that the copper wires were not exposed onto the surface (shown in FIG. 6).

Figure 7:
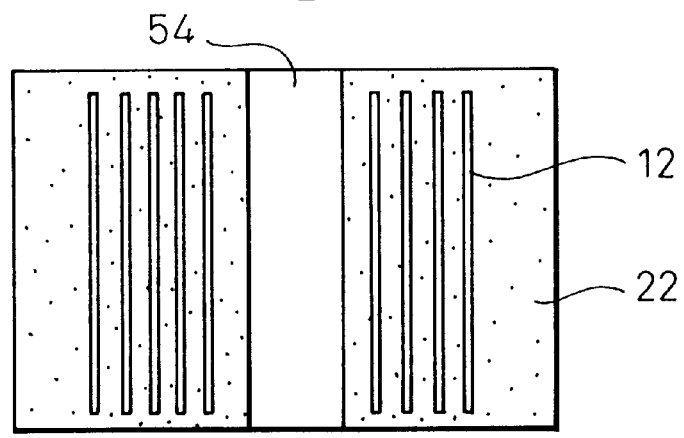
FIG. 7 is a schematic illustration showing an unfired body formed in Embodiment 6.

The sediment of slurry was sufficiently dried and solidified in the cylindrical container 50. Then the square pillar 52 of NC nylon was pulled out from the cylindrical container 50, and next the sediment body, that is, the unfired body formed into a pillar-shape having a through-hole 54 at the center was taken out from the cylindrical container. Slurry of the same composition as that described above, or a ceramic paste, was coated bottom surface of the unfired body from which the wires protrude and are exposed, that is, onto the bottom surface of the unfired body that had been in contact with the bottom of the cylindrical container, and then the coated slurry or ceramic paste was sufficiently dried (shown in FIG. 7). Then it was put on a molybdenum plate and subjected to a binder-removal treatment in the atmosphere of wet $N_2$. After that, the sediment body was fired in the atmosphere of dry $N_2$ at a maximum temperature of 1550° C. for 2 hours, so that a pillar-shaped sintered body was obtained.

Figure 8:
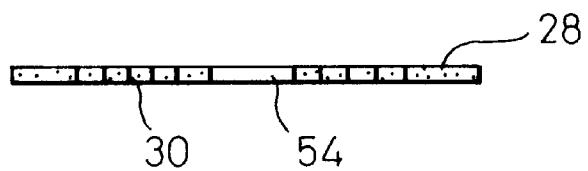
FIG. 8 is a cross sectional view of a ceramic substrate obtained in Embodiment 6.

This sintered body was cut with a multi-blade saw, so that a ceramic substrate 28, the thickness of which was approximately 0.5 mm, was provided (shown in FIG. 8). On this ceramic substrate 28, there was provided a rectangular through-hole 54 at the center, and further there was provided a via conductor 30. It was ascertained that the via conductor 30 was formed in a good condition.

According to the present invention, it is possible to provide a substrate having a via of high density and high positional accuracy by a manufacturing process much simpler than that of the conventional method. Further, the number of substrates obtained in one process is large. Therefore, the production cost can be greatly reduced. According to the present invention, the via conductor is not formed by laminating and connecting the green sheets, but the via is formed by cutting metallic wiring. Accordingly, no problems are caused with respect to the electric continuity because the displacement of lamination can be avoided, and further, the reproducibility of the shape and dimensional accuracy of the obtained substrate are high. According to the. invention, each substrate is not fired individually instead, the entire body is fired and then cut to obtain substrates. Accordingly, the substrate is not warped and the yield is high.

We claim:

1. A sintered body obtained by firing a slurry or paste ceramic and for manufacturing ceramic substrates, comprising:

a continuous, elongated non-laminated pillar shaped ceramic body formed of the slurry or paste ceramic, having a longitudinal axis, and having a first length; and at least one continuous, linear solid metallic wire, having a melting point lower than a firing temperature of said ceramic body, having a length less than the first length, and being arranged inside said ceramic body parallel to the longitudinal axis of the body;

wherein, as the slurry or paste ceramic is fired, the at least one metallic wire melts prior to formation of the sintered body, wherein said ceramic body has an outer surface, and wherein the at least one metallic wire is completely surrounded by said ceramic body prior to, during, and after firing so that the at least one metallic wire is not exposed onto the outer surface of said ceramic body.

2. A sintered body as set forth in claim 1, wherein said ceramic body has a through hole extending in parallel with and along said axis.

3. A sintered body as set forth in claim 1, wherein said at least one metallic wire is made of a selected one of copper, gold, silver or aluminum, or alternatively said at least one metallic wire is made of a metal having as a principal component a selected one of copper, gold, silver or aluminum.

4. A sintered body as set forth in claim 1, wherein said ceramic body is made of a selected one of alumina ceramic, aluminum nitride ceramic, mullite ceramic, and a ceramic containing 50 volume % of boro-silicate glass.

5. A sintered body for manufacturing a ceramic substrate, comprising:

a plurality of solid, continuous, linear parallel wires;

a slurry or paste ceramic surrounding said wires and forming, with said wires, a ceramic body, wherein said ceramic body is continuous, elongated, pillar shaped, non-laminated, and has an outer surface, a longitudinal axis, and a first length, wherein the wires have a length less than the first length, and are arranged parallel to the longitudinal axis of the body, thereby being completely surrounded by said ceramic body prior to, during, and after firing so that the wires are not exposed onto the outer surface of said ceramic body, wherein a melting point of the wires is lower than a firing temperature of said ceramic body, wherein the ceramic body, upon completion of firing, forms the sintered body, wherein the solid wires melt during firing and prior to completion of the sintered body, and wherein the wires are melted within the sintered body during firing, but again become solid after firing.

6. The sintered body as recited in claim 5, wherein the ceramic body has a through hole formed therein along the axis.

7. The sintered body as recited in claim 6, wherein the ceramic body has a via hole formed therein parallel to said axis.

8. The sintered body as recited in claim 5, wherein the ceramic body has a via hole formed therein parallel to said axis.

9. The sintered body as recited in claim 5, wherein at least a predominant portion of said wires is selected from the group of copper, gold, silver or aluminum.

10. The sintered body as recited in claim 5, wherein said ceramic body is selected from the group of alumina ceramic, aluminum nitride ceramic, mullite ceramic, and a ceramic containing 50 volume % of boro-silicate glass.

\* \* \* \* \*